(12) United States Patent
Moll et al.

(10) Patent No.: US 9,627,409 B2
(45) Date of Patent: Apr. 18, 2017

(54) SEMICONDUCTOR DEVICE WITH THIN-FILM RESISTOR

(71) Applicant: GLOBALFOUNDRIES Inc., Grand Cayman (KY)

(72) Inventors: Hans-Peter Moll, Dresden (DE); Andrei Sidelnicov, Dresden (DE); Maciej Wiatr, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/982,112

(22) Filed: Dec. 29, 2015

(65) Prior Publication Data

US 2016/0300856 A1 Oct. 13, 2016

(30) Foreign Application Priority Data

Apr. 7, 2015 (DE) ........................ 10 2015 206 175

(51) Int. Cl.
| | |
|---|---|
| *H01L 21/76* | (2006.01) |
| *H01L 27/12* | (2006.01) |
| *H01L 49/02* | (2006.01) |
| *H01L 29/786* | (2006.01) |
| *H01L 29/06* | (2006.01) |

(Continued)

(52) U.S. Cl.
CPC ........ *H01L 27/1207* (2013.01); *H01L 21/762* (2013.01); *H01L 21/76898* (2013.01); *H01L 21/8258* (2013.01); *H01L 28/20* (2013.01); *H01L 29/0649* (2013.01);

(Continued)

(58) Field of Classification Search
None
See application file for complete search history.

(56) References Cited

U.S. PATENT DOCUMENTS 6,140,910 A * 10/2000 Smith ...................... H01L 28/20
257/E21.004
6,242,298 B1 * 6/2001 Kawakubo ........ H01L 21/31691
257/E21.009

(Continued)

FOREIGN PATENT DOCUMENTS

DE 102010028465 A1 11/2011

OTHER PUBLICATIONS

German Office Action for Application No. 102015206175.2 dated Jan. 3, 2016.

(Continued)

*Primary Examiner* — Michael Lebentritt
(74) *Attorney, Agent, or Firm* — Amerson Law Firm, PLLC

(57) ABSTRACT

A semiconductor device with a metal-containing layer, a first semiconductor layer, that is formed on top of the metal-containing layer, and a resistor that is formed in the metal-containing layer and that is contacted through the first semiconductor layer is provided. Furthermore, a method of manufacturing a semiconductor device is provided, wherein the method comprises manufacturing of a resistor with the following steps: formation of a metal-containing layer over a wafer, particularly a SOI wafer, formation of a first semiconductor layer on top of the metal-containing layer and formation of a contact through the semiconductor layer to the metal-containing layer.

17 Claims, 5 Drawing Sheets

(51) Int. Cl.
*H01L 21/768* (2006.01)
*H01L 21/762* (2006.01)
*H01L 29/66* (2006.01)
*H01L 21/8258* (2006.01)

(52) U.S. Cl.
CPC .. *H01L 29/66757* (2013.01); *H01L 29/78603* (2013.01); *H01L 29/78675* (2013.01)

(56) References Cited

U.S. PATENT DOCUMENTS

| | | | | |
|---|---|---|---|---|
| 6,352,921 | B1* | 3/2002 | Han | H01L 21/76807 257/E21.579 |
| 6,544,833 | B2* | 4/2003 | Kawakubo | H01L 21/31122 257/E21.253 |
| 7,241,663 | B2* | 7/2007 | Howard | H01L 28/20 257/E21.004 |
| 7,365,397 | B2* | 4/2008 | Nomura | H01L 27/0629 257/358 |
| 7,981,759 | B2* | 7/2011 | Cervin-Lawry | H01G 4/33 257/E21.004 |
| 8,377,763 | B2* | 2/2013 | Kanike | H01L 27/0629 257/350 |
| 8,569,127 | B2 | 10/2013 | Chen et al. | |
| 8,779,526 | B2* | 7/2014 | Hsu | H01L 27/0629 257/379 |
| 8,940,598 | B2* | 1/2015 | Baldwin | H01L 27/0629 438/210 |
| 8,981,527 | B2 | 3/2015 | Yang et al. | |
| 9,000,564 | B2* | 4/2015 | Montanini | H01L 27/0629 257/379 |
| 9,117,677 | B2* | 8/2015 | Ma | H01L 23/5228 |
| 9,156,258 | B2* | 10/2015 | Isshiki | B41J 2/14201 |
| 2009/0090977 | A1 | 4/2009 | Freeman et al. | |

OTHER PUBLICATIONS

Translation of Official Communication from German Patent Application No. 10 2015 206 175.2 dated Dec. 10, 2015.

\* cited by examiner

SEMICONDUCTOR DEVICE WITH THIN-FILM RESISTOR

FIELD OF THE PRESENT INVENTION

The present invention generally relates to the field of manufacturing of integrated circuits and relates particularly to resistors that are to be installed in complex integrated circuits.

DESCRIPTION OF THE STATE OF THE ART

In modern integrated circuits, a very large number of individual switching elements such as field effect transistors in the form of CMOS, NMOS, PMOS elements, resistors, capacitors and the like is produced on an individual chip area. Typically, the structural sizes of these circuit elements are constantly reduced with the integration of each new circuit generation in order to provide the latest available circuits with an improved performance with regard to speed and/or power input. A reduction of the size of the transistors is an important aspect for the further improvements of the device performance in complex integrated circuits such as CPUS. The reduction of the size typically comes with an increase of the switching speed whereby the signal processing performance is improved.

In addition to the large number of transistor elements, also a plurality of passive circuit element such as capacitors and resistors is to be installed typically in an integrated circuit as predetermined by the fundamental circuit structure. Due to the small dimensions of the circuit elements, not only the performance of the individual transistor elements is improved, but also their packing density is increased, which comes with the possibility to integrate more and more functions in a given chip area. For this reason, very complex circuits were formed, which can have different types of circuits such as analog circuits, digital circuits and the like, whereby complete systems are provided on a single chip (SoC).

Although transistor elements are the essential circuit elements in complex circuits and therefore essentially determine the overall performance of these devices, other devices such as capacitors and resistors are also required, whereby the size of these passive circuit elements is to be adapted in terms of scaling of the transistor elements in order to avoid the use of valuable chip surface in an undesired way. The passive circuit elements such as the resistors have to be provided with a high degree of accuracy in order to respect the applied limits with regard to the fundamental circuit structure. For example, appropriate resistor values within very narrow tolerance ranges have to be provided for, even in essentially digital circuit arrangements, to avoid contributing excessively to operating instabilities and/or a longer signal dispersion delay.

For example, resistors are often used as "integrated polysilicon" resistors, which are formed on top of the semiconductor layer and/or respective insulation structures, in complex applications in order to maintain the desired resistance value without contributing to the parasitic capacitance in a significant way as is the case in "buried" resistor structures that are produced within the active semiconductor layer. A typical polysilicon resistor therefore requires the separation of the fundamental polysilicon material that is frequently combined with the separation of a polysilicon gate electrode material for the transistor elements. Also the resistors, whose size is essentially dependent on the underlying specific resistance value of the polysilicon material and on the type and concentration of the applied doping material that is built into the resistors in order to adjust the resistance values, are formed during the structural design of the gate electrode structures.

In principle, the known polysilicon resistors have disadvantages due to local density variations and doping material inhomogeneities. Such manufacturing variations become of course increasingly unfavorable with a growing miniaturization of the ICs. In addition, the resistor of the polysilicon material is dependent on the crystalline sub-structure of said resistor. A reliable setting of clearly defined resistance values is therefore more complicated.

FIG. 1 shows a typical example for an integrated polysilicon resistor of the state of the art as it can be formed, for instance, as part of the gate-first manufacturing process for transistor devices. FIG. 1 shows a semiconductor layer 1, for example a silicon semiconductor layer of a SOI wafer. In the shown example of the state of the art, a resistor is formed above an insulating area such as a shallow trench insulating area.

A thin, metal-containing layer 3, for example a thin TiN layer, is formed on the surface of the insulating area 2 and the adjacent surface of the semiconductor layer 1. Within a manufacturing process to produce an integrated circuit (an IC) with thin-film transistors (TFTs), parts of the thin, metal-containing layer 3 that are not shown in FIG. 1 can form parts of polymetal gate electrodes of the TFTs. A doped polysilicon layer 4 is formed on the thin, metal-containing layer 3. Within a manufacturing process to produce an IC with TFTs, parts of the doped polysilicon layer 4, which are not shown in FIG. 1, can form source/drain areas of the TFTs.

The part of the doped polysilicon layer 4 shown in FIG. 1 represents an integrated polysilicon resistor. The resistor is contacted via a NiSi layer 6 by means of the contacts 7 that are formed in an interlayer dielectric 8. The NiSi layer 6 works as an etch stop layer during the formation of apertures for the contacts 7 in the interlayer dielectric 8. However, during etching of the apertures for the contacts 7 in the interlayer dielectric 8, there is the risk of etching through the NiSi layer 6. This risk of etching through, which is connected to an undesired changed resistor behavior, is another disadvantage of the manufacturing process of integrated polysilicon resistors of the state of the art.

In view of the situation described above, the present invention relates to methods and semiconductor devices in which a higher reliability regarding the provision of resistor structures is achieved, whereby one of or several of the problems identified above is/are prevented or at least reduced.

OVERVIEW OF THE INVENTION

In general, the present invention provides semiconductor devices and methods for their production in which an increased reliability with regard to the production of resistor structures, for example integrated in the production of complex gate electrode structures, is achieved.

A semiconductor element is provided with a metal-containing layer, with a first semiconductor layer that is formed above or on the metal-containing layer, and with a resistor that is formed in the metal-containing layer and contacted through the first semiconductor layer. The metal-containing layer is relatively thin, i.e. designed particularly with a thickness of less than 100 nm or less than 50 nm, and can be made of TiN or comprise TiN.

Furthermore, an illustrative semiconductor device comprises a transistor that is formed in and on top of a semiconductor area that is formed in a semiconductor layer, which is arranged above a substrate, and a resistor that is formed on top of or on an insulation structure that is formed in the semiconductor layer. The transistor thereby comprises a part of a metal-containing layer, at least as part of its gate electrode, and the resistor comprises another part of the metal-containing layer. This metal-containing layer is formed above the semiconductor area and the insulation structure. The metal-containing layer is relatively thin, i.e. formed in particular with a thickness of less than 100 nm or less than 50 nm, and can be made of TiN or comprise TiN.

Further, a method of manufacturing of a semiconductor device is provided, wherein the process comprises the production of a resistor with the following steps: formation of a metal-containing layer (for example of a layer with TiN) above or on a wafer, particularly a SOI wafer, formation of a first semiconductor layer (for example a layer with (poly) silicon) above ore on the metal-containing layer and formation of a contact through the semiconductor layer to the metal-containing layer.

The SOI waver on top of which the metal-containing layer is formed can comprise a semiconductor layer above a buried oxide layer that is formed on or above a substrate.

BRIEF DESCRIPTION OF THE DRAWINGS

Further embodiments of the present invention are defined in the enclosed patent claims and can be derived more clearly from the following detailed description. The drawings show:

DETAILED DESCRIPTION

Figure 1:
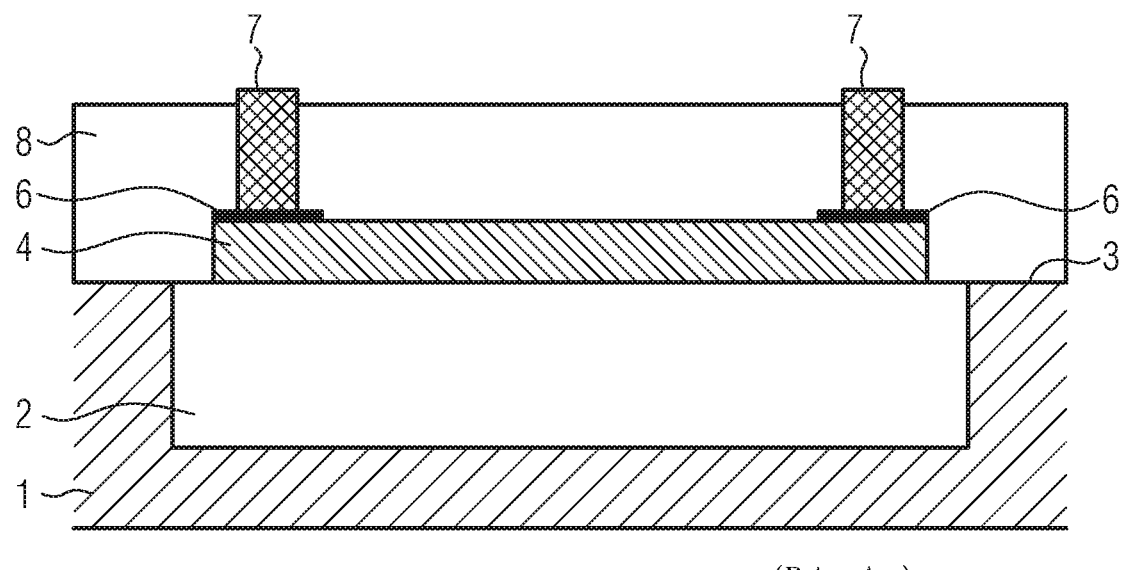
FIG. 1 an integrated polysilicon resistor of the state of the art.

Although the present invention is described with reference to the embodiments as they are illustrated in the following detailed descriptions as well as in the drawings, it should be taken into account that the following detailed description as well as the drawings do not intend to limit the present invention to the specific illustrative embodiments, but that the described illustrative embodiments rather show the diverse aspects of the present invention whose scope of protection, in contrast, is defined exclusively and in an exemplary way by the enclosed patent claims.

The present invention generally relates to semiconductor devices and processes for their production, whereby resistor structures with a high degree of compatibility with conventional SOI manufacturing processes are produced. The resistor structures are formed of a thin metal-containing layer that can also be used for the formation of gate electrodes of TFTs as part of the general manufacturing process.

Further illustrative embodiments can now be described in greater detail with reference to the enclosed drawings.

Figure 2A:
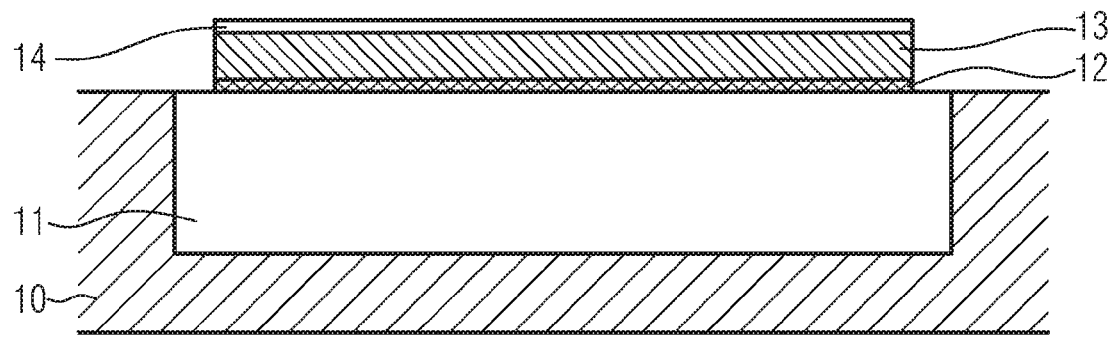
FIGS. 2a to 2e the manufacturing process of a resistor according to an example of the present invention.

FIG. 2a shows a semiconductor layer 10 that can comprise for example silicon. For example, the semiconductor layer 10 can represent a silicon layer of a SOI wafer, which is formed above a buried insulation layer, for instance a buried oxide layer. The buried insulation layer can be formed on top of a substrate. The substrate can be a semiconductor substrate that comprises for example silicon or a mix of silicon and germanium. In the shown example of an embodiment of the present invention, a resistor is formed on top of an insulation area 11 that can comprise an oxide material. The insulation area 11 can represent a shallow trench insulation for the electric insulation of an area, on top of which the resistor is formed, of another device area in which for example one or several TFTs are designed. A thin metal-containing layer 12 is formed on the surface of the insulation area 11 as well as on the surface of the semiconductor layer 10 that is adjacent to the insulation area 11. The thin metal-containing layer 12 can have a thickness of 10 to 100 nm, for example of 20 to 50 nm and can be made of TiN or contain this material.

On top of or on the thin metal-containing layer 12, there is a semiconductor layer 13 that can comprise or that is formed of silicon, particularly polysilicon. In the configuration shown in FIG. 2a, a mask layer 14 is formed on top of the semiconductor layer 13 in addition. This mask layer 14 can be formed throughout the whole resistor structure and serves as a protection against a silicidation process that is used in the general production process for the silicidation of gate and/or drain/source electrodes of TFTs that are to be produced in other areas of the wafer.

Figure 2B:
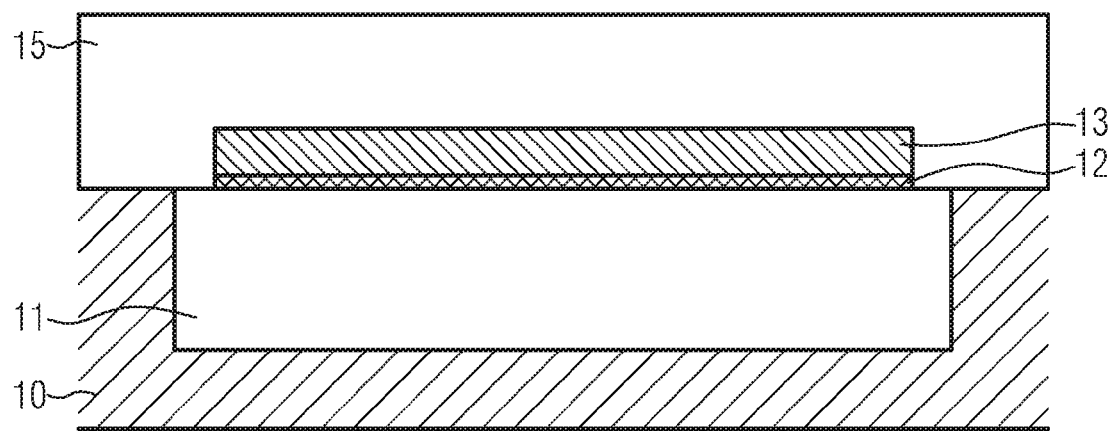

As displayed in FIG. 2b, the semiconductor layer 13 is enveloped by a interlayer dielectric material 15 in a next step after removal of the mask layer 14 after the mentioned silicidation process. In principle, the mask layer 14 could be maintained at least partially prior to the separation of the interlayer dielectric material 15. The formation of the interlayer dielectric material 15 can comprise an oxidation process and a chemical-mechanical polishing process. The interlayer dielectric material 15 is made of any suitable material, for example silicon oxide or the like. It can be an interlayer dielectric of a lowest metallization layer.

Figure 2C:
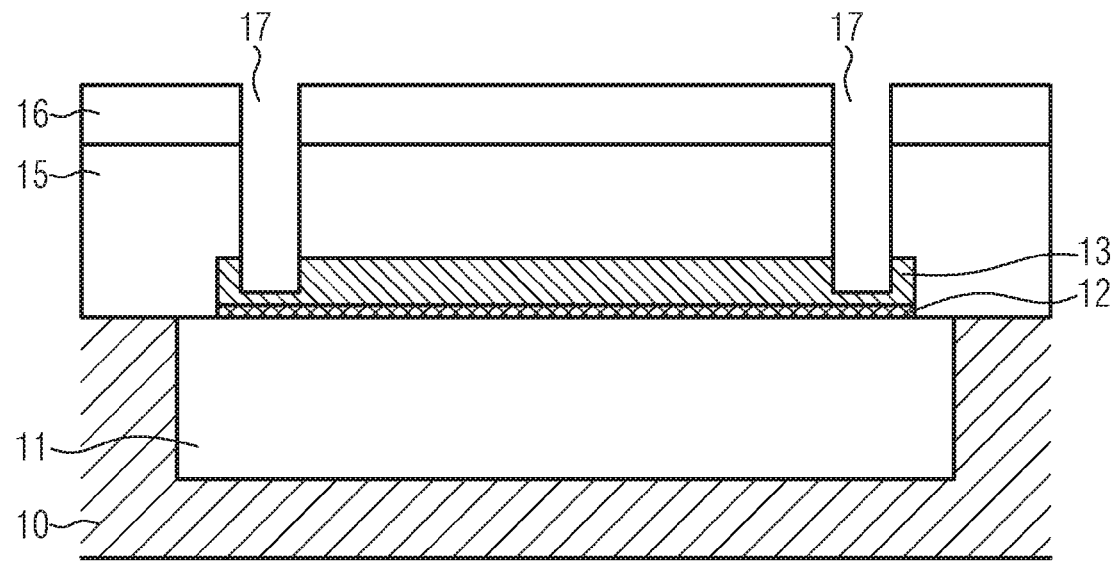

As shown in FIG. 2c, an etching mask 16, for example a hard carbon mask, is separated and structured on the interlayer dielectric material 15. Apertures 17 are etched into the interlayer dielectric material 15 through the apertures of the structured etching mask 16. Thereby, over-etching into the semiconductor layer 13 takes place as no etching stop layer is planned to be installed above the semiconductor layer 13. Other contact apertures in other device areas can end on etching stop layers provided accordingly that consist for example of NiSi or that comprise NiSi.

Figure 2D:
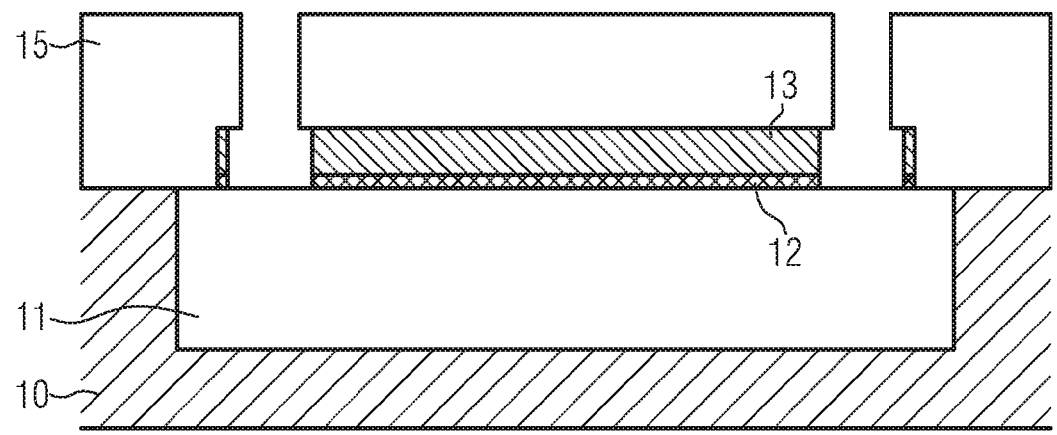

After etching of the apertures 17, a forming semiconductor oxide, for example silicon oxide, can be removed. The oxide removal can be done by means of a diluted HF. As shown in FIG. 2d, another subsequent etching process of the semiconductor material of the semiconductor layer 13 that initially remains in the apertures 17 takes place. If the semiconductor layer 13 is designed accordingly, the etching process can be a wet polysilicon etching procedure and leads to extended contact areas above the thin metal-containing layer 12 that is used as a resistor element as shown in FIG. 2d.

Figure 2E:
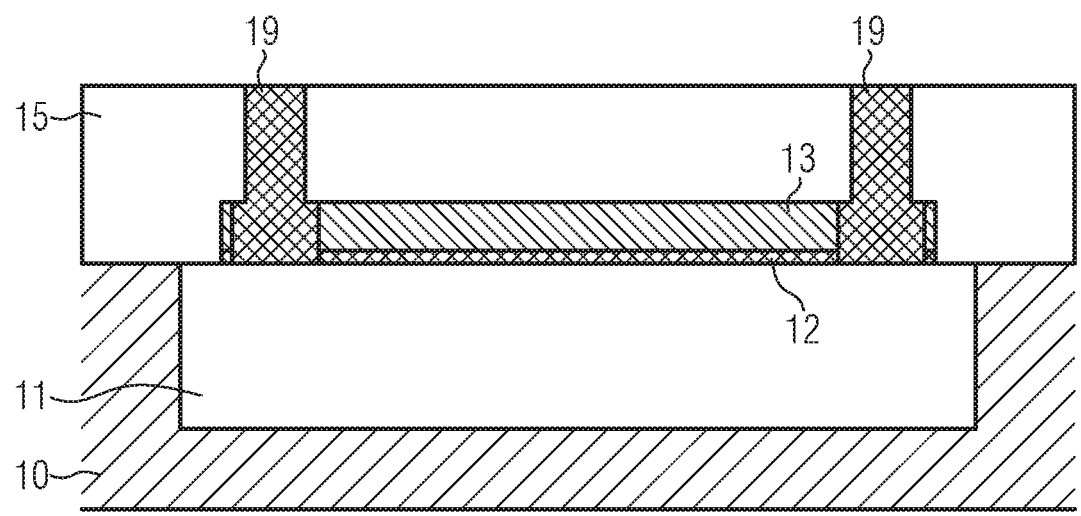

Finally, the apertures 17 are filled with a contact metal 19, for example tungsten, as shown in FIG. 2e. Due to the preceding etching process of the semiconductor material of the semiconductor layer 13 that initially remains in the apertures 17, the diameter of the emerging contact is at first larger in the semiconductor layer 13 than in the interlayer dielectric material 15. Prior to filling with the contact metal 19, a barrier layer can be separated as a protection against diffusion of the material of the thin metal-containing layer 12. After the separation procedure of the contact metal 19, a leveling process on the surface of the interlayer dielectric material 15 takes place, for example by means of a chemical/mechanical polishing process. Unlike in the state of the art (cf. FIG. 1), a resistor is formed of the thin metal-containing layer 12 and not of the semiconductor layer 13. Variations of the resistance values can be minimized this way and a resistance adjustment can take place in a reliable manner. In addition, the resistance value to be set can be controlled better due to a more homogeneous temperature coefficient of the thin metal-containing layer 12 compared to the doped polysilicon that is used in the state of the art. Through the relatively smooth wet etching process after the formation of the apertures, enlarged contact areas can be provided. The risk of etching through the thin metal-containing layer 12 is thereby only low as only a relatively smooth selective etching with a carefully dosed etching rate is required for removal of the material of the semiconductor layer 13 after opening the interlayer dielectric material 15 with an over-etching process in the semiconductor layer 13.

The production method of a thin layer resistor illustrated in the FIGS. 2a to 2e can be integrated in the general manufacturing process of an IC with other passive devices such as buried polysilicon resistors, and particularly with TFTs and other active devices.

Figure 3A:
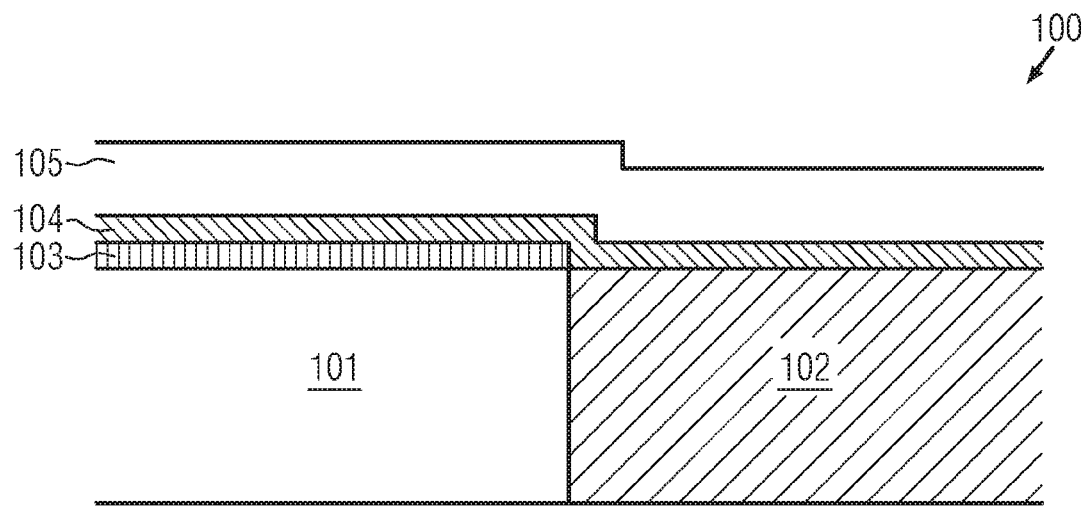
FIGS. 3a and 3b the manufacturing process of a resistor and a transistor device according to an example of the present invention.

The production of a resistor as a process integrated in the production of a TFT is described with reference to the FIGS. 3a to 3b. As shown in FIG. 3a, a semiconductor device 100 comprises a semiconductor area 101 and an insulation structure 102, for example a shallow trench insulation. The insulation structure 102 can be formed into the semiconductor layer of a SOI wafer. In this case, the semiconductor area 101 is part of the semiconductor layer of the SOI wafer. The semiconductor layer and hence the semiconductor area 101 can comprise silicon. It can comprise other iso-electronic devices such as germanium, carbon, silicon germanium, silicon carbon or other II-VI or III-V semiconductor compositions.

The SOI wafer can comprise a buried oxide layer beneath the semiconductor layer and an underlying substrate. The buried oxide layer can comprise silicon (di)oxide or a borosilicate glass. This substrate beneath the buried oxide layer can be a germanium, silicon germanium, gallium phosphate or gallium arsenide substrate. The thickness of the semiconductor layer can be in the range of 20 to 100 nm, and the thickness of the buried oxide layer can be in the range of 10 to 50 nm.

Moreover, a gate dielectric material 103 is formed at least above the semiconductor area 101 in the manufacturing phase shown in FIG. 3, while, in other cases and as a function of the type of the material used and the respective production method, the gate dielectric material 103 can also be located above the insulation structure 102. The gate dielectric material 102 can be formed through oxidation and/or separation and the like. It can be a material with a high dielectric constant k, for example k>20, which is separated for example with a thickness in the range of 10 to 30 nm. It can comprise a combination of a high-k material and a common dielectric material in the form of silicon oxide or a nitrogen-bearing composition. For example, the gate dielectric material 103 can be provided in form of a hafnium-based material. The gate dielectric material 103 can comprise hafnium oxide, hafnium silicon oxide or similar materials. Materials such as tantalum oxide ($Ta_2O_5$) with a dielectric constant k of approximately 25, strontium titanium oxide ($SrTiO_3$) with a dielectric constant k of approximately 150, or zirconium oxide ($ZrO_2$) can be used.

A thin metal-containing layer 104 is formed on the gate dielectric material 103 and on the insulation structure 102. The thin metal-containing layer 104 can comprise TiN or essentially consist of TiN and have a thickness of less than 100 nm or of less than 50 nm, especially of 20 to 50 nm. A semiconductor layer 105, for example a polysilicon layer or a layer that contains silicon and/or germanium, is formed on top of the gate dielectric material 102 and on the thin metal-containing layer 104. A gate electrode of a TFT is formed above the semiconductor area 101 by means of the thin metal-containing layer 104 and the semiconductor layer 105. A resistor is formed on top of the insulation structure 102 by means of the thin metal-containing layer 104.

Figure 3B:
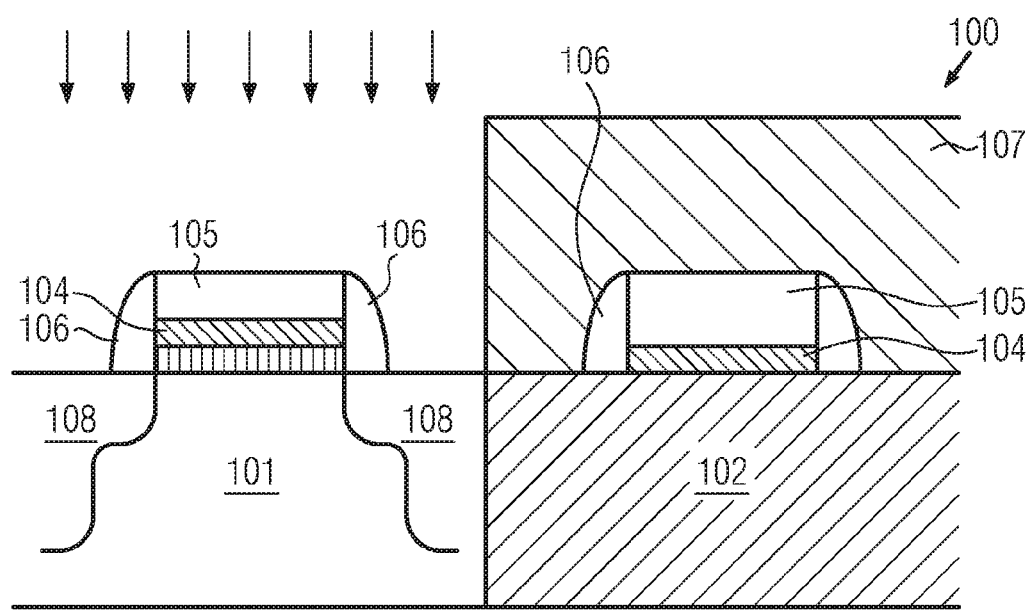

FIG. 3b schematically displays the semiconductor device 100 in a further advanced manufacturing stage. A transistor structure with a gate electrode 104, 105 is formed on top of a gate dielectric 103 and side wall spacers 106 above the semiconductor area 101 by means of appropriate masking and etching steps. A mask 107 above the insulation area protects the resistor element to be formed against an implantation process (indicated by arrows in FIG. 2b), which is used for the formation of source drain areas 108 of the TFT in the semiconductor area 101. After finishing the implantation process, the mask 107 is removed. If desired, the gate electrode 105 and the source drain areas 108 of the TFT can be silicidated. In this case, the semiconductor layer 105 on top of the thin metal-containing layer 104 above the insulation structure 102 can be protected against the silicidation process by means of a cover layer (cf. FIG. 2a).

After finishing the TFT, an interlayer dielectric can be formed on top of the resulting structure. Contacting systems to the thin layer resistor that is formed on top of the insulation structure 102 by means of the thin metal-containing layer 104 can be formed as described by means of the FIGS. 2a to 2e. In addition, the gate electrode and the source drain areas 108 of the TFT can be contacted appropriately through the interlayer dielectric.

The present invention consequently provides resistor elements and manufacturing processes for such resistor elements, which are characterized by good controllability, reliability and adjustability of the resistor features. As part of the integrated production with TFTs, the resistor elements can be made of the same thin metal-containing layer that is used for the production of the gate electrodes of the TFTs.

Further modifications and variations of the present invention are evident for specialists on the basis of this description. Therefore, this description is meant to be merely illustrative and for the purposes of conveying the general mode of implementation of the embodiments to specialists. Of course, the forms shown and described herein shall only be regarded as exemplary embodiments. In particular, the order of the described manufacturing steps can be varied or combined appropriately.

The invention claimed is:

1. A semiconductor device, comprising:
   a first layer comprising a metal and not including silicon;
   a first semiconductor layer that is formed on top of said first layer;
   a resistor that is formed in said first layer,
   an interlayer dielectric positioned above said first semiconductor layer; and
   an electric contact that is positioned in said interlayer dielectric and extends through said first semiconductor layer and contacts said first layer.

2. The semiconductor device of claim 1, further comprising an insulation structure that is positioned in a second semiconductor layer beneath said first layer.

3. The semiconductor device of claim 2, further comprising a buried oxide layer of an SOI wafer positioned under said second semiconductor layer and a bulk substrate positioned under said buried oxide layer.

4. The semiconductor device of claim 1, wherein a portion of said electric contact that physically contacts said first semiconductor layer has a larger lateral dimension than a portion of said electric contact positioned in said interlayer dielectric.

5. The semiconductor device of claim 4, wherein a portion of said electric contact that physically contacts said first layer has a larger lateral dimension than said portion of said electric contact positioned in said interlayer dielectric.

6. A semiconductor device, comprising:
   a semiconductor layer;
   an isolation structure defined in said semiconductor layer;
   a transistor positioned above said semiconductor layer, said transistor comprising a first portion of a first layer comprising a metal and not including silicon and a gate electrode positioned above said first portion of said first layer; and
   a resistor positioned entirely above said isolation structure, said resistor comprising a second portion of said first layer.

7. The semiconductor device of claim 6, wherein said semiconductor layer is an active layer of an SOI wafer.

8. The semiconductor device of claim 6, wherein said gate electrode comprises a first portion of a further semiconductor layer and wherein said resistor comprises a second portion of said further semiconductor layer that is positioned above said second portion of said first layer.

9. The semiconductor device of claim 8, further comprising:
   an interlayer dielectric positioned above said transistor and above said resistor;
   a first electric contact that is positioned in said interlayer dielectric and extends through said second portion of said further semiconductor layer and conductively contacts said second portion of said first layer of said resistor; and
   a second electric contact that is positioned in said interlayer dielectric and conductively contacts said gate electrode of said transistor.

10. The semiconductor device of claim 8, further comprising:
    an interlayer dielectric that is positioned above said resistor; and
    an electric contact that is positioned in said interlayer dielectric and extends through said second portion of said further semiconductor layer and conductively contacts said second portion of said first layer of said resistor, wherein a portion of said electric contact that physically contacts said second portion of said further semiconductor layer of said resistor has a larger lateral dimension than a portion of said electric contact positioned in said interlayer dielectric.

11. The semiconductor device of claim 10, wherein a portion of said electric contact that physically contacts said second portion of said first layer of said resistor has a larger lateral dimension than said portion of said electric contact positioned in said interlayer dielectric.

12. The semiconductor device of claim 1, wherein said first layer comprises TiN.

13. The semiconductor device of claim 6, wherein said first layer comprises TiN.

14. A semiconductor device, comprising:
    a first layer comprising a metal;
    a first semiconductor layer that is formed on top of said first layer;
    an interlayer dielectric positioned above said first semiconductor layer;
    a resistor that is formed in said first layer; and
    an electric contact that is positioned in said interlayer dielectric, extends through said first semiconductor layer, and contacts said first layer, wherein a portion of said electric contact that physically contacts said first semiconductor layer has a larger lateral dimension than a portion of said electric contact positioned in said interlayer dielectric.

15. The semiconductor device of claim 14, wherein a portion of said electric contact that physically contacts said first layer has a larger lateral dimension than said portion of said electric contact positioned in said interlayer dielectric.

16. The semiconductor device of claim 14, further comprising an insulation structure that is positioned in a second semiconductor layer beneath said first layer.

17. The semiconductor device of claim 16, further comprising a buried oxide layer of an SOI wafer positioned under said second semiconductor layer and a bulk substrate positioned under said buried oxide layer.

* * * * *